US012596145B2

(12) United States Patent　　　(10) Patent No.:　US 12,596,145 B2
Pickerd et al.　　　　　　　　　　　(45) Date of Patent:　　　Apr. 7, 2026

(54) OPTICAL TUNING TEST SYSTEM USING PARALLEL OVEN PIPELINES WITH PARALLEL INSTRUMENT CHANNELS AND MACHINE LEARNING ASSISTANCE

(71) Applicant: Tektronix, Inc., Beaverton, OR (US)

(72) Inventors: John J. Pickerd, Hillsboro, OR (US); Evan Douglas Smith, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 18/756,281

(22) Filed: Jun. 27, 2024

(65) Prior Publication Data

US 2024/0353491 A1　　　Oct. 24, 2024

Related U.S. Application Data

(63) Continuation-in-part of application No. 18/126,342, filed on Mar. 24, 2023, now Pat. No. 12,442,852.
(Continued)

(51) Int. Cl.
*G01R 31/28*　　　(2006.01)
*G01R 31/319*　　(2006.01)
(52) U.S. Cl.
CPC ... *G01R 31/2862* (2013.01); *G01R 31/31908* (2013.01)
(58) Field of Classification Search
CPC .................. G01R 31/2862; G01R 31/31908
See application file for complete search history.

(56) References Cited

U.S. PATENT DOCUMENTS 5,272,723 A　　12/1993　Kimoto
5,397,981 A　　3/1995　Wiggers
(Continued)

FOREIGN PATENT DOCUMENTS

CN　　107342810 B　　11/2019
EP　　2743710 A1　　9/2018
(Continued)

OTHER PUBLICATIONS

Varughese, Siddarth, et al., "Accelerating Assessments of Optical Components Using Machine Learning: TDECQ as Demonstrated Example", Journal of Lightwave Technology, Jan. 1, 2021, pp. 64-72, vol. 39, No. 1, IEEE.
(Continued)

*Primary Examiner* — Joseph D Torres
(74) *Attorney, Agent, or Firm* — Miller Nash LLP; Andrew J. Harrington

(57)　　　　　　ABSTRACT
A test system includes a test and measurement instrument, ovens to hold devices under test (DUT), each oven having an oven switch selectably connected to the DUTs, channel switches selectably connected to the oven switches and to one channel of the instrument, one or more processors to: select an oven and its oven switch, connect that oven switch to a subset of DUTs in that oven, connect the channel switches to that oven switch to receive signals from the subset of DUTs, send the signals to channels of the instrument to acquire waveforms from the subset of DUTs in parallel, and repeat connecting of the channel switches and that oven switch until the instrument has acquired waveforms from each DUT in that oven, use machine learning to tune each DUT, test whether each DUT in that oven is optimally tuned, and repeat until all DUTs have been tuned and tested.

18 Claims, 7 Drawing Sheets

Related U.S. Application Data

(60) Provisional application No. 63/325,373, filed on Mar. 30, 2022, provisional application No. 63/513,331, filed on Jul. 12, 2023.

(56) References Cited

U.S. PATENT DOCUMENTS

| | | | |
|---|---|---|---|
| 5,594,655 | A | 1/1997 | Berchin |
| 6,807,496 | B2 | 10/2004 | Pickerd |
| 7,181,146 | B1 | 2/2007 | Yorks |
| 7,298,463 | B2 | 11/2007 | French et al. |
| 7,420,385 | B2 | 9/2008 | Hunter et al. |
| 8,185,339 | B2 | 5/2012 | Maeda |
| 8,384,410 | B1 | 2/2013 | De La Puente et al. |
| 8,583,395 | B2 | 11/2013 | Dybsetter |
| 8,861,578 | B1 | 10/2014 | Lusted |
| 9,059,803 | B2 | 6/2015 | Detofsky |
| 9,130,751 | B2 | 9/2015 | Zivny |
| 9,337,993 | B1 | 5/2016 | Lugthart |
| 9,548,858 | B1 | 1/2017 | Cirit |
| 9,699,009 | B1 | 7/2017 | Ainspan |
| 9,709,605 | B2 | 7/2017 | Alley |
| 10,171,161 | B1 | 1/2019 | Cote et al. |
| 10,209,276 | B2 | 2/2019 | Tan |
| 10,236,982 | B1 | 3/2019 | Zhuge |
| 10,270,527 | B1 | 4/2019 | Mentovich et al. |
| 10,396,897 | B1 | 8/2019 | Malave |
| 10,585,121 | B2 | 3/2020 | Absher |
| 10,727,973 | B1 | 7/2020 | Kumar et al. |
| 10,852,323 | B2 | 12/2020 | Schaefer |
| 10,863,255 | B2 | 12/2020 | Zhang |
| 11,005,697 | B2 | 5/2021 | Liston |
| 11,040,169 | B2 | 6/2021 | Jung |
| 11,095,314 | B2 | 8/2021 | Medard |
| 11,177,986 | B1 | 11/2021 | Ganesan |
| 11,233,561 | B1 | 1/2022 | O'Shea et al. |
| 11,237,190 | B2 | 2/2022 | Rule |
| 11,336,378 | B2 | 5/2022 | Buttoni |
| 11,388,081 | B1 | 7/2022 | Sommers et al. |
| 11,476,967 | B2 | 10/2022 | Geng |
| 11,646,863 | B2 | 5/2023 | Balan et al. |
| 11,695,601 | B2 | 7/2023 | Sudhakaran |
| 12,146,914 | B2 * | 11/2024 | Agoston .......... G01R 31/31908 |
| 12,442,852 | B2 * | 10/2025 | Pickerd .............. G01R 31/2834 |
| 2003/0053170 | A1 | 3/2003 | Levinson |
| 2003/0208330 | A1 | 11/2003 | Pickerd |
| 2003/0220753 | A1 | 11/2003 | Pickerd |
| 2004/0032889 | A1 | 2/2004 | Hidaka |
| 2004/0121733 | A1 | 6/2004 | Peng |
| 2004/0131365 | A1 | 7/2004 | Lee |
| 2004/0136422 | A1 | 7/2004 | Mahowald |
| 2004/0165622 | A1 | 8/2004 | Lu |
| 2004/0223544 | A1 | 11/2004 | Upton |
| 2004/0236527 | A1 | 11/2004 | Felps |
| 2005/0222789 | A1 | 10/2005 | West |
| 2005/0246601 | A1 | 11/2005 | Waschura |
| 2005/0249252 | A1 | 11/2005 | Sanchez |
| 2006/0120720 | A1 | 6/2006 | Hauenschild |
| 2008/0126001 | A1 | 5/2008 | Murray |
| 2008/0159737 | A1 | 7/2008 | Noble |
| 2008/0212979 | A1 | 9/2008 | Ota |
| 2009/0040335 | A1 | 2/2009 | Jungerman |
| 2009/0113260 | A1 | 4/2009 | Teng et al. |
| 2009/0240365 | A1 | 9/2009 | Niijima et al. |
| 2011/0085793 | A1 | 4/2011 | Oomori |
| 2011/0161738 | A1 | 6/2011 | Zhang |
| 2011/0286506 | A1 | 11/2011 | Libby |
| 2012/0226727 | A1 | 9/2012 | Zivny |
| 2013/0046805 | A1 | 2/2013 | Smith |
| 2014/0093233 | A1 | 4/2014 | Gao |
| 2014/0163914 | A1 | 6/2014 | Alley |
| 2014/0343883 | A1 | 11/2014 | Libby |
| 2015/0003505 | A1 | 1/2015 | Lusted |
| 2015/0055694 | A1 | 2/2015 | Juenemann |
| 2015/0207574 | A1 | 7/2015 | Schoen |
| 2015/0350042 | A1 | 12/2015 | Zivny |
| 2016/0131699 | A1 | 5/2016 | Hamilton |
| 2016/0191168 | A1 | 6/2016 | Huang et al. |
| 2016/0328501 | A1 | 11/2016 | Chase |
| 2018/0006721 | A1 | 1/2018 | Ishizaka |
| 2018/0045761 | A1 | 2/2018 | Tan |
| 2018/0074096 | A1 | 3/2018 | Absher |
| 2018/0204117 | A1 | 7/2018 | Brevdo |
| 2018/0219636 | A1 | 8/2018 | Gale |
| 2018/0356655 | A1 | 12/2018 | Welch |
| 2019/0038387 | A1 | 2/2019 | Chu |
| 2019/0278500 | A1 | 9/2019 | Lakshmi |
| 2019/0332941 | A1 | 10/2019 | Towal |
| 2019/0370158 | A1 | 12/2019 | Rivoir |
| 2019/0370631 | A1 | 12/2019 | Fais |
| 2020/0035665 | A1 | 1/2020 | Chuang |
| 2020/0057824 | A1 | 2/2020 | Yeh |
| 2020/0166546 | A1 | 5/2020 | O'Brien |
| 2020/0195353 | A1 | 6/2020 | Ye |
| 2020/0229206 | A1 | 7/2020 | Badie |
| 2020/0284839 | A1 | 9/2020 | Diegmann |
| 2020/0313999 | A1 | 10/2020 | Lee |
| 2020/0335029 | A1 | 10/2020 | Gao |
| 2021/0041499 | A1 | 2/2021 | Ghosal |
| 2021/0105548 | A1 | 4/2021 | Ye |
| 2021/0111794 | A1 | 4/2021 | Huang |
| 2021/0160109 | A1 | 5/2021 | Seol |
| 2021/0167864 | A1 | 6/2021 | Razzell |
| 2021/0173010 | A1 * | 6/2021 | Hsu ................ G01R 31/318314 |
| 2021/0314081 | A1 | 10/2021 | Shattil et al. |
| 2021/0389373 | A1 | 12/2021 | Pickerd |
| 2021/0390456 | A1 | 12/2021 | Pickerd |
| 2022/0070040 | A1 | 3/2022 | Namgoong |
| 2022/0076715 | A1 | 3/2022 | Lee |
| 2022/0099729 | A1 | 3/2022 | Lin |
| 2022/0121388 | A1 | 4/2022 | Woo |
| 2022/0182139 | A1 | 6/2022 | Zhang |
| 2022/0199126 | A1 | 6/2022 | Lee |
| 2022/0200712 | A1 | 6/2022 | Lillie |
| 2022/0215865 | A1 | 7/2022 | Woo |
| 2022/0236326 | A1 | 7/2022 | Schaefer |
| 2022/0239371 | A1 | 7/2022 | Xu |
| 2022/0247648 | A1 | 8/2022 | Pickerd |
| 2022/0311513 | A1 | 9/2022 | Pickerd et al. |
| 2022/0311514 | A1 | 9/2022 | Smith et al. |
| 2022/0334180 | A1 | 10/2022 | Pickerd |
| 2022/0373597 | A1 | 11/2022 | Agoston |
| 2022/0373598 | A1 | 11/2022 | Tan et al. |
| 2022/0385374 | A1 | 12/2022 | Arikawa |
| 2022/0390515 | A1 | 12/2022 | Pickerd et al. |
| 2022/0393914 | A1 | 12/2022 | Tan |
| 2022/0407595 | A1 | 12/2022 | Varughese |
| 2023/0050162 | A1 | 2/2023 | Tan |
| 2023/0050303 | A1 | 2/2023 | Pickerd |
| 2023/0052588 | A1 | 2/2023 | Sudhakaran |
| 2023/0088409 | A1 | 3/2023 | Parsons |
| 2023/0098379 | A1 | 3/2023 | Smith et al. |
| 2023/0194599 | A1 | 6/2023 | Gilabert |
| 2023/0228803 | A1 | 7/2023 | Sun |
| 2023/0239182 | A1 | 7/2023 | Ikeda |
| 2023/0299862 | A1 | 9/2023 | O'Shea |
| 2023/0306578 | A1 | 9/2023 | Pickerd |
| 2023/0314498 | A1 | 10/2023 | Pickerd |
| 2023/0387483 | A1 | 11/2023 | Murphy et al. |

FOREIGN PATENT DOCUMENTS

| | | | |
|---|---|---|---|
| EP | 3936877 | A1 | 1/2022 |
| JP | 6560793 | B1 | 8/2019 |
| WO | 2021092156 | A1 | 5/2021 |
| WO | 2022171645 | A1 | 8/2022 |
| WO | 2022189613 | A1 | 9/2022 |

OTHER PUBLICATIONS

Varughese, Siddarth, et al., "Accelerating TDECQ Assessments using Convolutional Neural Networks, OFC", Mar. 2020, 3 pages, The Optical Society (OSA).

(56) References Cited

OTHER PUBLICATIONS

Watts et al., "Performance of Single-Mode Fiber Links Using Electronic Feed-Forward and Decision Feedback Equalizers", 2005, IEEE Photonics Techology Letters, vol. 17, No. 10, pp. 2206-2208 (Year: 2005).

Echeverri-Chacon et al., "Transmitter and Dispersion Eye Closure Quaternary (TDECQ) and Its Sensitivity to Impairments in PAM4 Waveforms", 2019, Journal of Lightwave Technology, vol. 37, No. 3, pp. 852-860 (Year: 2019).

Wang et al., "Intelligent Constellation Diagram Analyzer Using Convolutional Neural Network-Based Deep Learning," Optics Express, Jul. 24, 2017, vol. 25, No. 15, 17 pages.

* cited by examiner

OPTICAL TUNING TEST SYSTEM USING PARALLEL OVEN PIPELINES WITH PARALLEL INSTRUMENT CHANNELS AND MACHINE LEARNING ASSISTANCE

CROSS-REFERENCE TO RELATED APPLICATIONS

This application is a continuation-in-part of U.S. patent application Ser. No. 18/126,342, filed Mar. 24, 2023, "OPTICAL TRANSCEIVER TUNING USING PARALLEL PIPELINE MACHINE LEARNING ASSISTANCE," and claims benefit of U.S. Provisional Application No. U.S. Provisional Application No. 63/325,373, titled "OPTICAL TRANSCEIVER TUNING USING PARALLEL PIPELINE MACHINE LEARNING ASSISTANCE," filed on Mar. 30, 2022, and U.S. Provisional Application No. 63/513,331, titled "OPTICAL TUNING TEST SYSTEM USING PARALLEL OVEN PIPELINES WITH PARALLEL INSTRUMENT CHANNELS AND MACHINE LEARNING ASSISTANCE," filed on Jul. 12, 2023, the disclosure of all is incorporated herein by reference in its entirety.

TECHNICAL FIELD

This disclosure relates to test and measurement systems, and more particularly to systems and methods for tuning parameters of a device under test (DUT), for example an optical transceiver device.

BACKGROUND

Machine learning techniques can improve the test time for tuning parameters of a device under test (DUT). U.S. Pat. Nos. 11,923,895, and 11,923,896, each issued Mar. 5, 2024, the entire contents of which are hereby incorporated by reference into this disclosure, both disclose systems and methods for tuning parameters of DUTs, such as optical transceivers. Those systems and methods can improve the test time for tuning an optical transceiver or other DUTs, for example in a manufacturing environment. Those systems and methods may decrease the optical transceiver tuning parameter test time from a worst-case example of two hours per DUT down to approximately 12 seconds per DUT per temperature, for an optimal tuning parameter set prediction and validation. This represents a very significant speed up compared to the worst-case conventional tuning processes.

However, the DUT tuning processes may include tuning at different temperatures. The time needed to bring the DUT up or down to each desired tuning temperature(s) contributes significant delay. For example, in some tuning processes, each temperature ramp up time is 180 seconds. Furthermore, it may take additional time to load and remove the DUTs into and out of temperature chambers used for testing. Therefore, what is needed is an overall system design and method that can reduce the temperature cycle time, and the switching out of devices in the oven, to virtually zero time.

U.S. patent application Ser. No. 18/126,342, filed Mar. 24, 2023, hereinafter "the '342 application," the entire contents of which are hereby incorporated by reference into this disclosure, describes a test system using parallel pipelined ovens where the transmitters output from each oven are processed serially in one scope channel at a time.

DETAILED DESCRIPTION

Embodiments of the disclosure address issues in reducing temperature cycle time in testing DUTs, combined with a machine learning (ML) system to speed up the overall time to test DUTs. The embodiments generally provide systems and methods in which the total tuning time only depends on one scope channel and the amount of time machine learning takes per transmitter. These systems and methods then result in the ability to output a fully tuned transmitter, tuned at multiple temperatures. In one embodiment, a system using three temperatures can run at an uninterrupted rate of 36 seconds for each transmitter. This represents a two hundred times speed up of the two-hour tuning time for the worst-case example of conventional tuning processes.

Embodiments of the disclosure use novel techniques for pipelining the processing of data, use a novel machine learning element, and use novel techniques for using the serial sequencing of a different instrument, such as an oscilloscope ("scope"), channel for a different temperature chamber, or oven. Embodiments of the disclosure generally do not parallelize the scope channel acquisitions between channels to obtain the 200× speed up factor. Rather, embodiments of the disclosure generally process the channels serially one channel at a time. This avoids the very expensive and time-consuming process of redesigning oscilloscope hardware and software to accommodate parallel channel processing because parallel channel processing is not needed. Another advantage of the overall test configuration is that minimizes the layers of optical, or other, switches needed in the signal path between the DUT and the scope to be only one layer. This offers an advantage of reducing costs and improving signal integrity compared to trying to process four waveforms input in parallel into four scope channels at the same time as some current manufacturing systems do.

The embodiments employ a parallel pipeline architecture. The number of pipelines equals the number of ovens, or temperature chambers, used. The number of pipelines also corresponds to the number of switches connected to the DUTs in each oven to cycle through the DUTs, the dimensions of the switch that selects between the switches connected to each oven, and the number of scope or test instrument channels. Another dimension is the number of DUTs per oven. Each of the oven DUT switches, those that connect to the DUTs in the oven, will have a number of switches equal to the number of DUTs in the oven.

The following discussion uses a particular number of ovens, DUT switches, a particular dimension of the instrument switch, and a particular number of channels on a test and measurement instrument. These numbers are for ease of discussion and understanding and are in no way intended to limit the number of any component in the system.

Figure 1:
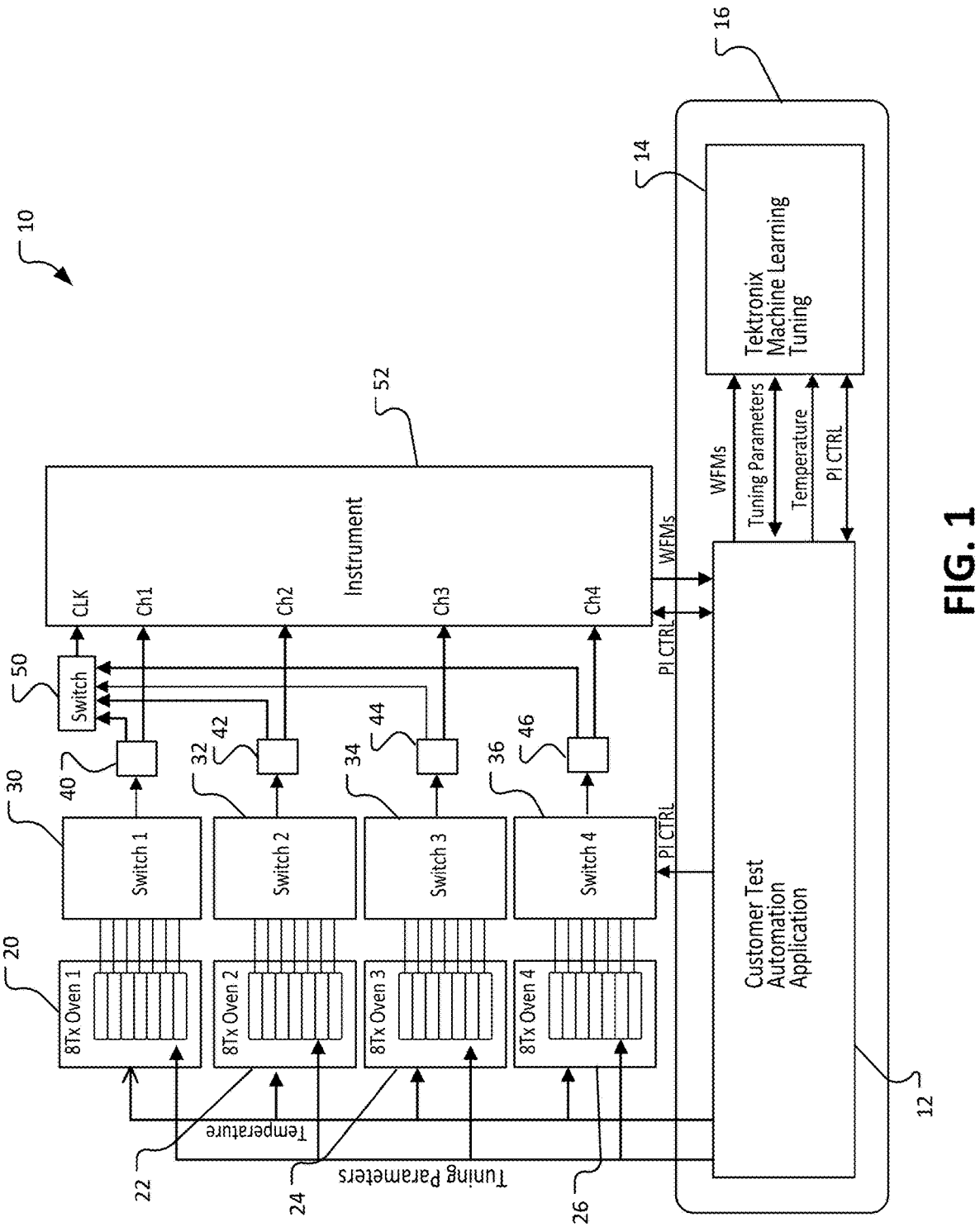
FIG. 1 shows an embodiment of a test system using pipelining.

The embodiment of FIG. 1 shows a pipeline system 10 under the control of a customer test automation application 12 and a machine learning system 14. These may both reside on the same computing device 16, which may have one or more processors, or may be distributed among multiple computing devices each with one or more processors. The customer test automation application 12 may controls the switches through a programmatic interface (PI). Similarly, the test automation application may interact with the instrument and the machine learning system also through a programmatic interface.

One example embodiment uses four ovens, 20, 22, 24 and 26. This translates to four pipelines, four DUT switches, 30, 32, 34, and 36, and a 4×1 instrument switch 50 that connects each DUT switch to the scope clock, CLK. The Tx, transmitter, must be tuned for three or more temperatures, and each temperature takes 180 seconds to ramp up. To take advantage of the parallel architecture, the embodiments of the disclosure overlap the ramp up times of the temperature change in each oven. The end result is the oven ramp-up times go to a virtual time of 0 s. Likewise, the time to take transmitters in and out of the oven also goes to virtually 0 s. Each pipeline also contains serial operation tasks.

In the embodiment, each oven contains eight transmitters to be brought up to temperature. The DUTs in this embodiment comprise optical transmitters, but any type of tunable DUT, optical or electronic may use this system. "Electronic" DUTs are those DUTs that are not optical devices. Having eight transmitters per oven results in each DUT switch 30, 32, 34, and 36 being 8×1 switches. In the case of optical transmitters, these are optical switches.

Even though the eight transmitters in one oven are heated in parallel, they shall be tuned one at a time serially into one instrument channel. This avoids costly redesigns of the instrument to allow for parallel processing of all channels.

Each DUT switch may connect to a splitter that splits the signal between the instrument switch 50 and the channel on the instrument 52. The splitters 40, 42, 44, and 46, pick off some of the signal from each of four DUT switch outputs to be applied to the 4×1 instrument switch that outputs into the CLK input of the sampling scope. This is for the purpose of clock recovery for the scope to acquire the signal on each channel.

The instrument switch 50 selects the appropriate 8×1 DUT switch output to tune the transmitters in the oven that has completed ramping up to the correct temperatures. The selected 8×1 DUT switch will cycle through all the transmitters in the oven.

In operation, the test and measurement instrument acquires the waveforms from the transmitters. One of the aspects of this system is that only one channel is processed at a time in serial fashion. The channels are not processed in parallel. This is because only one channel at a time will be ramped up to the correct channel. For example, when oven 20 is up to temperature then channel 1 will acquire waveforms from each of the 8 transmitters in series in that oven at that temperature. The user test automation application 12 will pass these waveforms to the Tektronix Optical Tuning algorithm 14 for training the deep learning network and for predicting optimal tuning parameters and for computing TDECQ validation of the resulting tuning. This means that the time to tune a transmitter depends only on the acquisition time of the oscilloscope, and on the DSP processing time of the optical tuning applications. The Tektronix Optical Tuning algorithm, or machine learning system, uses machine learning to provide tuning parameters for the optical transceivers based upon the waveforms received from the DUTs.

The customer application 12 acts as the primary controller of the overall system. It has responsibility for timing and sequencing of all the tasks for all four of the parallel pipelines. These tasks include setting the temperatures of the ovens. The controller may pause while an operator or robot loads and unloads transmitters into and out of the oven and may control the robot if one is used. The tasks also include loading tuning parameters into the transmitters and controlling an oscilloscope to acquire waveforms from the transmitters. The controller also collects the waveforms and the parameters and sends them to the Optical Tuning Application to train deep learning networks, to receive back predictions of optimal tuning parameters, and to receive measurements on the waveforms for validation of tuning. The control of the system is embodied in one or more processors configured to execute code to operate the various aspects of the system. The one or more processors may be located on the test automation application 12 running on a separate computing device from the instrument and the machine learning system. Each of those may have their own processors, they may all be contained in one system, or any mix in between.

The controller also controls the 8×1 DUT switches to select from which transmitter in an oven to collect a waveform and controls the 4×1 instrument switch to select the correct output of the 8×1 switches to apply into the clock recovery input CLK of the scope. The controller also controls the instrument to acquire the waveforms from the correct channel of the instrument depending on which channel has an oven that is currently ramped up to the temperature for the tuning operation. As will be seen with reference to FIG. 2, an unused period of time, in this embodiment 96 seconds, exists between the ramp up of the temperature of each oven and the tuning interval for the transmitters in that oven at that temperature.

As mentioned above, the tuning process employs a novel machine learning system that undergoes training to associate a set of tuning parameters for each DUT based upon the waveforms. The process may iterate until the DUTs have been determined to either pass or fail. The machine learning system accelerates the cycle of tuning the DUTs and then testing them to determine operational pass or fail. The testing process involves a measurement process that also relies upon the machine learning system. This system has demonstrated that it reduces the tuning interval to 12 seconds per transmitter per temperature. With the ramp up time period for each oven essentially reduced to zero, the system can achieve a tuning interval of 36 seconds per transmitter across three temperatures.

Figures 2, 3:
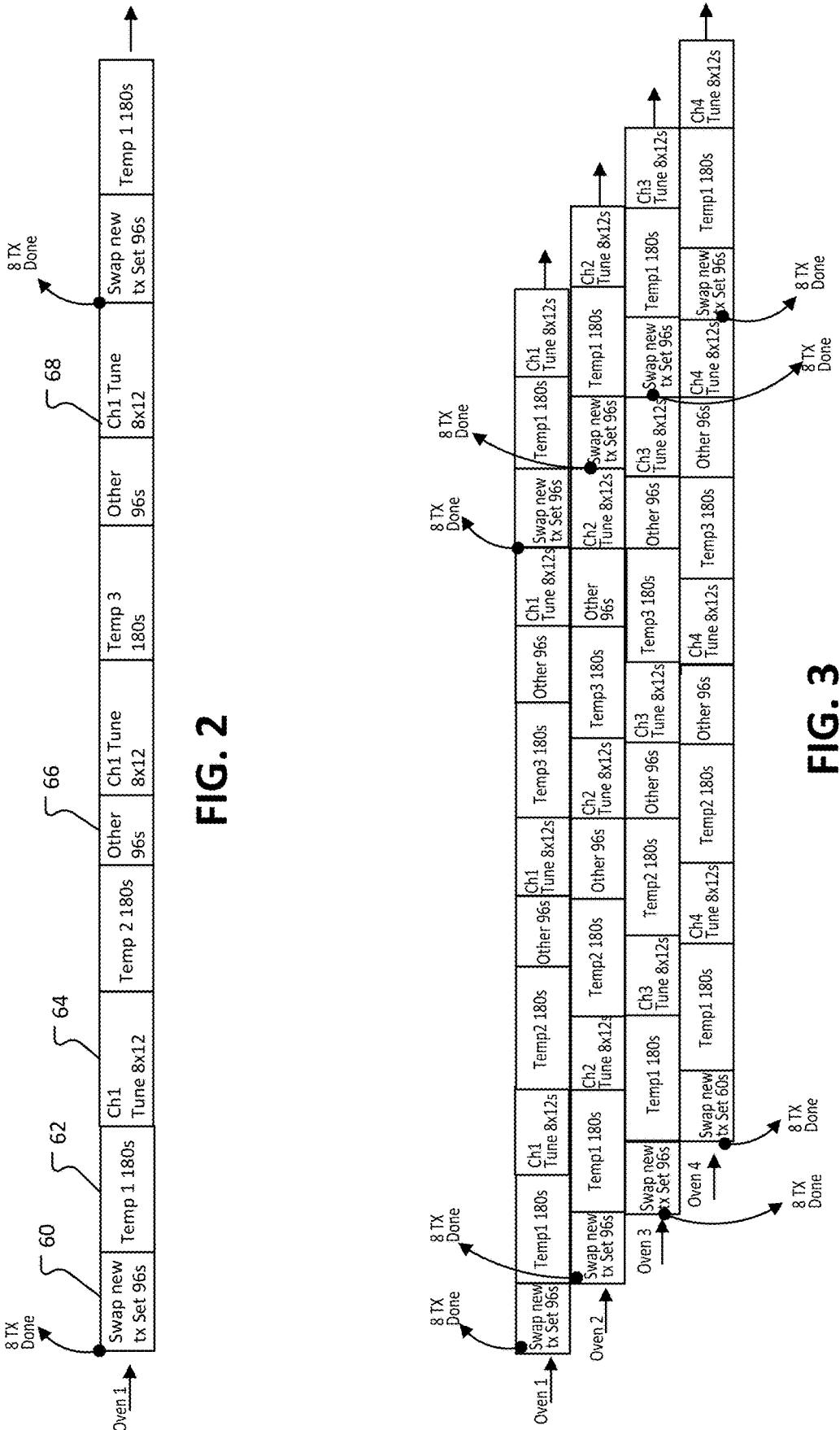
FIG. 2 shows a pipeline diagram for an embodiment of a test system.
FIG. 3 shows how four pipelines are aligned in timing.

FIG. 2 shows one of the pipelines, and FIG. 3 shows the four parallel pipelines, each source by an oven. In FIG. 2. Oven 1, having tuned a set of transmitters, receives a new set at 60. At 62, the oven ramps up to the first temperature, which takes 180 seconds. The transmitters then undergo tuning and testing using the machine learning system at 64, which takes 12 seconds per transmitter, or 96 seconds for the set of 8 to be tested at that temperature. Upon completion of tuning and testing, the oven then ramps up to a second temperature. There is an unused time interval of 96 seconds at 66. The process then continues with tuning and testing, ramping up to the third temperature, another unused time interval of 96 seconds, then the final tuning and testing at 68. FIG. 2 only shows a view of one oven and one pipeline. The efficiency and advantages of the pipelining approach result from combining multiple pipelines as shown in FIG. 3.

In FIG. 3, one can see that the four ovens source the parallel pipelines. The top pipeline is the pipeline shown in FIG. 2. More pipelines could be added with the addition of more ovens. The process loads the second oven upon completion of the loading of the first oven. As stated above, the tuning time for each transmitter takes 12 seconds. This breaks down as 2 seconds per acquisition for four waveforms, 1 second for the machine learning DSP to predict tuning parameters, 2 seconds to compute TDECQ (transmitter dispersion eye closure quaternary) the measurement used to determine pass/fail, and a 1 second margin for a total of 12 seconds per transmitter. Each testing and tuning block computes while the other three ovens are in different phases of ramping up to temperature.

After each testing and tuning block there is another block for that pipeline to ramp up to the next temperature. After each pipeline has computed tuning for each temperature then the 8 transmitters in that oven are ready to unload, and a new set of 8 transmitters are loaded to repeat the cycle. The unused time intervals allow for the system to perform other operations that may not be covered by the optical tuning algorithm. The pipeline sequencing times may be adjusted if needed.

The parallel pipelines as shown in FIG. 3 provide the system to output fully tuned transmitters at an average ideal rate of one transmitter every 36 seconds. The tune times given represent the ideal, assuming machine learning predictions are 100% accurate. The 96 seconds overlap margins can cover some or all of any inaccuracy. Even with these built in intervals, the actual result is still expected to be many times faster than current methods used on the manufacturing lines.

As discussed above, the embodiments may have been discussed with regard to tuning optical transmitters, but the pipelining architecture and temperature testing could be applied to many different types of DUTs, optical or electronic.

In this manner, the embodiments pair the optical tuning machine learning systems mentioned with the novel parallel pipeline and instrument channel switching architecture to make the cycle times of the ovens go to virtual zero. This results in machine learning assisted speed up of predicting optimized tuning parameters. The embodiments achieve this tuning speed improvement of almost two hundred times, without the need to use parallel instrument acquisition channels.

In other embodiments, multiple channels of the test and measurement instrument could acquire waveforms from the DUTs in parallel. The below discussion focuses on specific dimensions for the DUTs, ovens, and switches for case of discussion and understanding. A more general embodiment follows the initial discussion.

The embodiments route outputs from four transmitters at a time in each oven into four channels of the instrument for parallel instrument acquisition. This requires an additional layer of optical switches. These embodiments rely upon multiple channels of acquisition with an acquisition time of 2 to 3 seconds, which becomes the largest part of the time used for making tuning and TDECQ and other measurement calculations with the aid of machine learning. Test systems according to embodiments of the '342 application using series scope channels achieve a nominal speed up factor of 75× for the machine learning tuning parameter prediction compared to a customer's typical time to tune. The embodiments here represent a 320× speed up of the original 2-hour tuning time for the worst-case customer.

Figure 4:
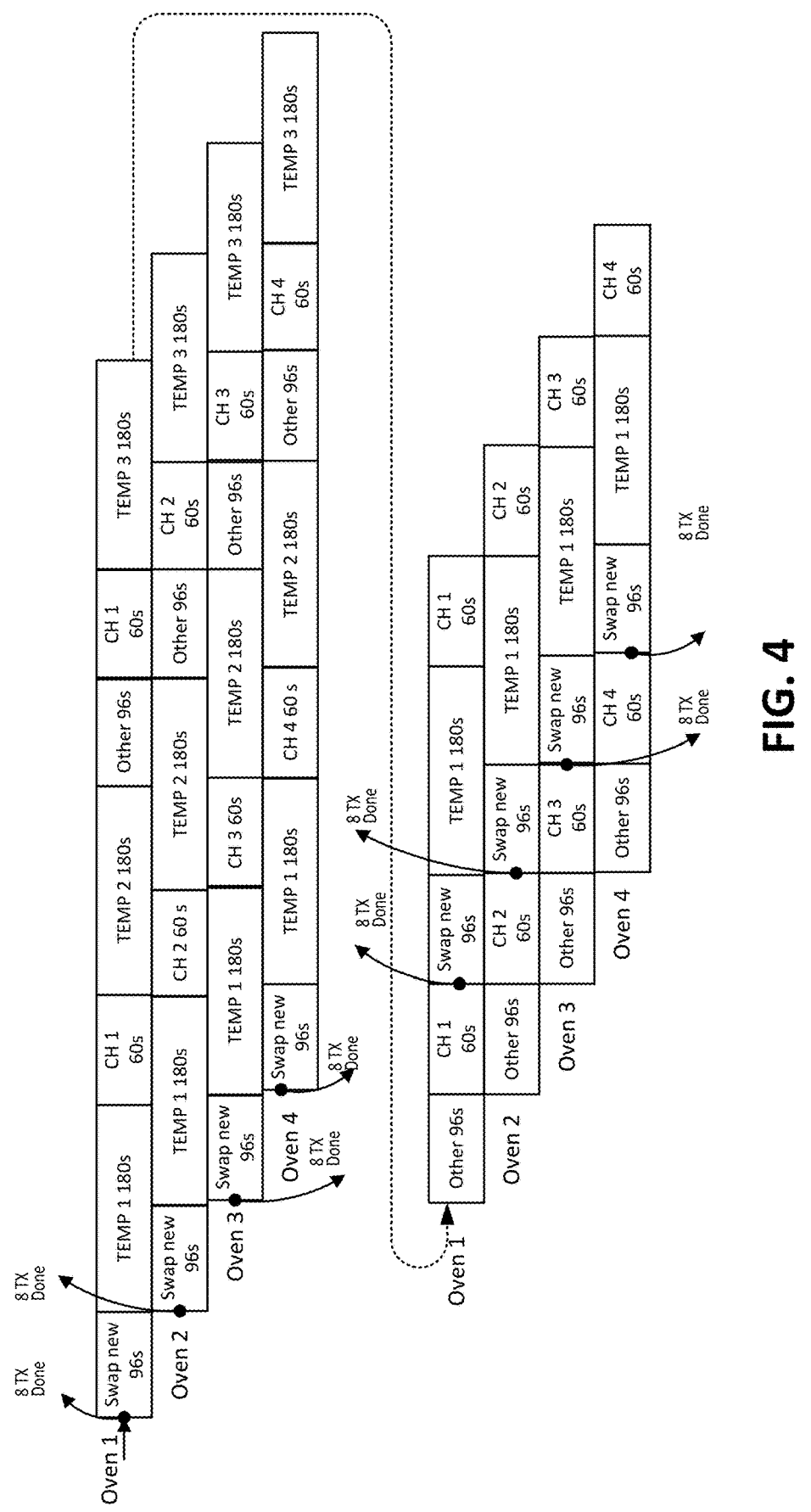
FIG. 4 shows timing alignment for an embodiment of four pipelines with four channels of a test and measurement instrument.
Figure 5:
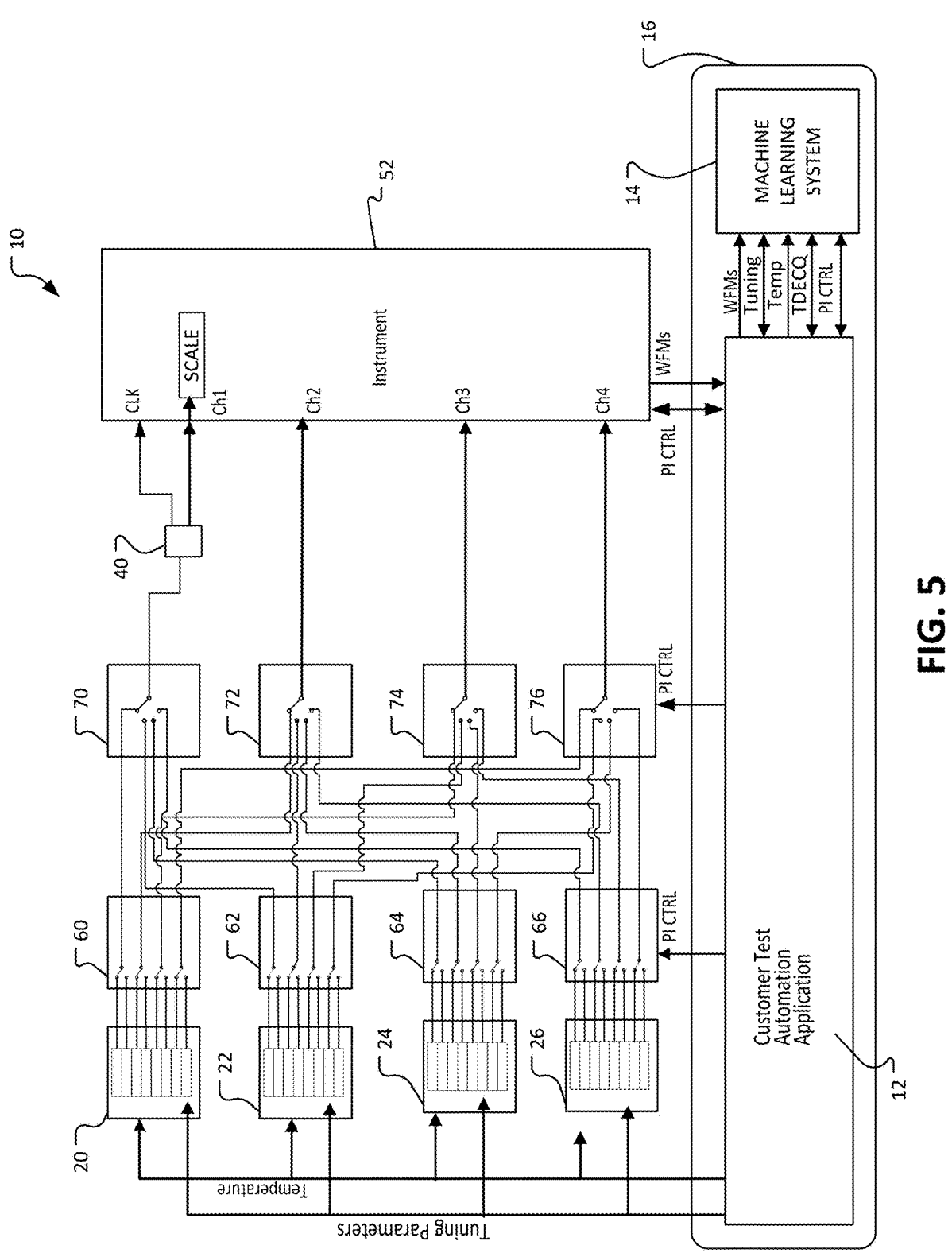
FIG. 5 shows an embodiment of a test system using optical tuning with machine learning.

FIG. 4 illustrates an example sequencing of test operations, and FIG. 5 illustrates a block diagram of an example test systems, according to some embodiments of the disclosure. The system is novel in the sense of how it pipelines the processing and includes a novel machine learning element for prediction of DUT transmitter tuning parameters. It is also novel in how it adds a second layer of switches which enables acquiring four channels at a time on the scope to significantly speed up the tuning process.

With reference to FIGS. 4 and 5, various embodiments of the disclosure may include combinations of one or more of the following aspects. A parallel pipeline architecture shown in FIG. 5 has four ovens; each oven comprises one pipeline so four ovens equal four pipelines. In this system, the DUTs, which may comprise optical transmitters, undergoes tuning at three or more temperatures. As will be discussed in more detail with regard to FIG. 9, the ramp up temperature affects the timing of each pipeline. In the embodiment of FIGS. 4 and 5 each oven takes 180 seconds to ramp up to a given temperature. Therefore, embodiments of the disclosure overlap the ramp up times of the temperature change in each oven. This results in the oven ramp-up times having a virtual time of 0 seconds. Likewise, the time to take transmitters in and out of the oven also goes to virtually 0 seconds. Each pipeline also contains serial operation DSP tasks in the oven which is up to temperature.

In the embodiments of FIGS. 4 and 5, each oven 20, 22, 24, and 26, contains 8 transmitters to be brought up to temperature, representing another parallel aspect of the architecture. As mentioned above, each oven represents the source of one of the serial pipelines, so the embodiments of FIGS. 4 and 5 have four serial pipelines in the architecture. Each oven cycles thru three temperature settings. One should note that embodiments of the disclosure can be configured for more or less ovens, and more or less transmitters per oven, and for one or more temperatures. Three temperatures are the most likely nominal requirement by customers on the manufacturing line. Furthermore, the term "oven" should be understood to generally mean a controlled temperature chamber. Thus, embodiments of the disclosure may also control the oven temperature(s) to be less than an ambient temperature to cool the DUTs if necessary.

In the particular embodiment shown in FIG. 5, the switches 60, 62, 64, and 66, each comprise four single pole double throw optical switches, or two double pole double throw optical switches, per oven. The discussion here will refer to these as "oven switches." These comprise a first layer of optical switches to select four of the eight transmitters in an oven that have come up to temperature. These four waveforms are then input to the second layer of optical switches.

A second layer of optical switches 70, 72, 74, and 76, comprise a second layer of single pole quadruple throw optical switches. There are four of these 4×1 switches in the second layer. Each switch selects one of the four waveforms from the oven that is currently up to temperature and routes them into four channels of the scope. One scope acquisition will acquire four waveforms simultaneously. This discussion refers to these switches as "channel" switches as each channel switch connects to one channel of the test and measurement instrument 52.

Some embodiments may use an optical splitter as in the embodiment of FIG. 1. The splitter 40 picks off some of the signal from one of the four optical switch outputs to be applied to the CLK recovery input of the sampling scope.

This allows clock recovery for the scope to acquire the signal on each channel. In the embodiment of FIG. 5, the scope may be an equivalent time (ET) oscilloscope (scope), an example of a sampling scope, as the test and measurement instrument. The embodiments that use an ET scope would use the splitter 40. Embodiments that use an RT scope would not have the splitter 40, nor the connection CLK on the instrument 52.

The embodiments that need the optical splitter to split off a portion of the signal to be input to the clock recovery input of the scope may require further processing. The sampling scope may include a math scale factor that needs to be applied to the input waveform to make it compatible with the waveforms on the other three channels of the scope. The scale block and splitter are not needed for embodiments using an RT scope.

In the embodiment of FIG. 5, the instrument acquires the waveforms from the transmitters. One of the key aspects of this system is that four channels are acquired at a time in parallel fashion. The time to tune a transmitter depends only on the acquisition time of the oscilloscope, and on the DSP processing time of the optical tuning applications.

As in FIG. 1, the embodiments of FIG. 4 having parallel channel acquisition include the Customer Test Automation Application 12 as the primary controller of the overall system. It is responsible for timing and sequencing of all the tasks for all four of the parallel pipelines. This includes setting the temperatures of the ovens. This includes pausing while an operator or robot loads and unloads transmitters into and out of the oven, loading tuning parameters into the transmitters, and controlling an instrument to acquire waveforms from the transmitters.

This also includes collecting the waveforms and the parameters and sending them to the Optical Tuning Application to train deep learning networks, and to receive back predictions of optimal tuning parameters and to receive measurements on the waveforms for validation of tuning. The control also includes controlling the first layer of 2×1 optical switches to select the transmitter(s) and from which to collect four waveforms within the oven that is currently up to temperature. The customer application 12 controls the second layer of switches which select the oven pipeline that is up temperature and controls the oscilloscope to acquire the waveforms from the scope while keeping track of which oven is currently ramped up to the temperature for the tuning operation. The timing includes 96 seconds of unused time interval that may be assigned for additional unspecified operations.

Block 14, as in FIG. 1, is the Machine Learning System 14. This block uses deep learning networks to predict the optimal tuning parameters, and to speed up measurements. The customer application and machine learning system may reside on a host PC 16, which may have a graphics processing unit (GPU). According to some embodiments, to obtain the desired speed up times, the host PC may have a clock speed of 5 GHz and uses a GPU.

In FIG. 4, the pipeline task structure specifies how the tasks are executed with some in parallel and some serially. This shows four parallel pipelines sourced by four ovens. The timing blocks show 96 second time intervals to load and unload the ovens with transmitters. The nature of the parallel pipeline organization makes this time block go to virtual 0 seconds. The larger blocks represent the ramp time of an oven when a temperature change is required. These are 180 seconds long in time. These are also virtual zero seconds where tune time only depends on the CHX 60s boxes' time length. The blocks that say CH X, where X is 1, 2, 3, or 4 in this embodiment, represent the time to tune 8 transmitters at a given oven temperature. For each transmitter, the time is 2 to 3 seconds per acquisition for four waveforms in parallel, 1 second for DSP to predict tuning parameters, 2 seconds to compute classic TDECQ, and 1 second margin. Refer to the Mathcad model equations below where green-Block is the amount of time to compute and acquire. Each CHX 60s block computes while the other three ovens are in different phases of ramping up to temperature. After each CHX 60s block there is another TEMP block for that pipeline to ramp up to the next temperature for testing. After each pipeline has computed tuning for each temperature then the 8 transmitters in that oven are ready to unload, and a new set of 8 transmitters are loaded to repeat the cycle. The Other blocks are spare unused intervals of time that allow for the system to perform other operations that may not be covered by the optical tuning algorithm. The pipeline sequencing times may be adjusted if needed to split up the gray blocks to include after each CHX 60s block to do other operations at each temperature. These blocks require virtual 0 seconds to execute.

The Mathcad model equations are as follows:

$$refPar := 3$$

$$scopeAcq := 2 \text{ seconds}$$

$$TDECQ := 2 \text{ seconds}$$

$$Tune := 1 \text{ second}$$

$$numTemp := 3$$

$$numTXperOven := 8$$

$$nominalTune := 15 \cdot 60 \text{ seconds}$$

$$numChannels := 4$$

The time estimates for parallel oven pipeline with parallel scope channels are:
For 1 DUT/transmitter:

$$greenBox := scopeAcq \cdot refPar \cdot \frac{numTXperOven}{numChannels} +$$
$$numTXperOven \cdot (Tune + TDECQ + \text{overhead} + scopeAcq)$$

$$greenBox = 60 \text{ seconds}$$

$$timeParallel := \frac{numChannels \cdot greenBox}{numChannels \cdot numTXperOven}$$

$$timeParallel := 7.5 \text{ seconds}$$

$$speedUp := \frac{nominalTune}{timeParallel}$$

$$speedUp = 120 \text{ seconds.}$$

The end result of the parallel pipelines as shown in FIG. 4 is to output fully tuned transmitters at an average ideal rate of one transmitter every 22.5 s. This is for tuning at three temperatures. The tune times given are ideal assuming machine learning predictions are 100% accurate. But there are still 96 s overlap margins to cover some or all of that inaccuracy. However, the expected real-life rate of tuned transmitters may be slower by some amount because the transmitters that fail must be tested with the users slower tuning algorithm. The actual result is still expected to be many times faster than current methods used on the manufacturing lines.

As an example, and for ease of discussion and understanding, refer to FIGS. 4 and 5. An example switching sequence, for the oven 20 pipeline in FIG. 5, goes as follows:

1. Load oven 1, 20, with 8 transmitters.
2. Start heating oven 20 up to the first temperature and wait 180 seconds. While oven 20 is heating, load oven 2, 22, with 8 transmitters and start heating oven 22 up to the first temperature for 180 seconds. While oven 22 is heating, load oven 3, 24, with 8 transmitters and start heating oven 24 up to the first temperature for 180 seconds. While oven 24 is heating, load oven 4, 26, with 8 transmitters and start heating oven 26 up to the first temperature for 180 seconds.
3. Set first level of switches to select four TX in oven 20, using switch 60.
4. Set second level of switches, to apply four oven 1 transmitters to four scope channels. In FIG. 5, switches 70, 72, 74 and 76 would receive waveforms from transmitters 1, 3, 5 and 7, respectively, from oven 20.
5. Place tuning reference parameters set 1 into the TX.
6. Acquire four TX waveforms from each of the first four selected transmitters.
7. Set the first layer of switches, switch 60, to select the second four TX in oven 20.
8. Acquire four TX waveforms from each of the second set of four selected transmitters in oven 1. Each of the switches 70, 72, 74, and 76, would receive waveforms from transmitters 2, 4, 6, and 8, respectively from oven 20.
9. Place reference parameter set 2 into the TX and acquire a second four waveforms.
10. Change the first layer of switches to select the other four transmitters. In this case the other subset would comprise transmitters 1, 3, 5, and 7.
11. Acquire four more waveforms with one acquisition cycle in parallel on the four scope channels.
12. Place the third set of reference tuning parameters in the transmitters.
13. Acquire four TX waveforms with one scope acquisition.
14. Change the first layer switch to select the other four TX in oven 1. Now the transmitters switch to the second subset 2, 4, 6, and 8.
15. Acquire four waveforms with one scope acquisition.
16. Sequence sending the three waveforms from each transmitter at temperature 1, into the OptaML tuning prediction block and receive back a set of predicted optimal tuning parameters for each of the 8 TX in oven 1.
17. Place the 8 optimal tuning parameters set into the associated transmitters.
18. Acquire four waveforms from the first four transmitters.
19. Change the first layer switch setting to select the second four transmitters.
20. Make one scope acquisition to acquire the four waveforms.
21. Compute TDECQ and other measurements on the 8 acquired waveforms to determine if each transmitter is optimally tuned.
22. Change oven 1 to start ramping up to temperature two.
23. At this point in time oven 2 has reached its 180 s soak time for temperature 1.
24. Switch second level switch to select transmitters from oven 2
25. Repeat steps 3 through 23 but using oven 2 at temperature 1.

26. Switch second level switch to select transmitters from oven 3
27. Repeat steps 3 through 23 but using oven 3 at temperature 1.
28. Switch second level switch to select transmitters from oven 4
29. Repeat steps 3 through 23 but using oven 4 at temperature 1.
30. Switch second level switch to select transmitters from oven 1
31. Repeat steps 3 through 23 but using oven 1 at temperature 2.
32. Switch second level switch to select transmitters from oven 2
33. Repeat steps 3 through 23 but using oven 2 at temperature 2.
34. Switch second level switch to select transmitters from oven 3.
35. Repeat steps 3 through 23 but using oven 3 at temperature 2.
36. Switch second level switch to select transmitters from oven 4
37. Repeat steps 3 through 23 but using oven 4 at temperature 2.
38. Switch second level switch to select transmitters from oven 1
39. Repeat steps 3 through 23 but using oven 1 at temperature 3.
40. Unload the 8 tuned transmitter from oven 1 and load 8 new transmitters to tune.
41. Repeat steps 3 through 23 but using oven 2 at temperature 3.
42. Output 8 tuned transmitters from oven 2 at all three temperatures.
43. Unload the 8 transmitters from oven 3 and load 8 new transmitters to tune.
44. Output 8 tuned transmitters from oven 3 at all three temperatures.
45. Repeat steps 3 through 23 but using oven 4 at temperature 3.
46. Output 8 tuned transmitters from oven 4 and load 8 new ones to tune.
47. Keep repeating the described cycles above to continuously output tuned transmitters with virtual 0 time for loading and unloading and ramping up to temperature. Time only depends on the acquisition time of scope, and the DSP time for predicting tuning parameters and validation with TDECQ.

Figure 6:
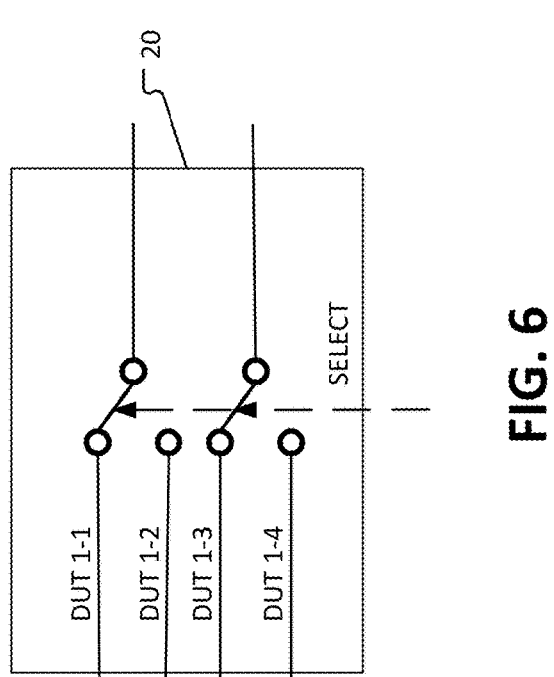
FIG. 6 shows an example of a single pole double throw optical switch.
Figure 7:
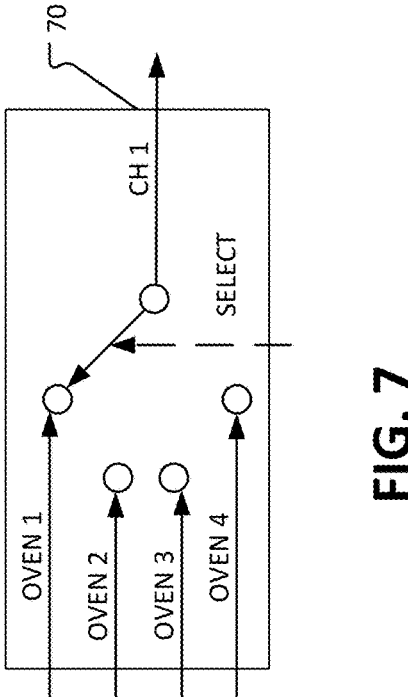
FIG. 7 shows an example of a dual single pole double throw optical switch.

FIGS. 6 and 7 show closer views of the first and second layers of optical switches. FIG. 6 shows an embodiment of half of switch 60, but could also apply to switches 62, 64, and 66. These types of switches are commercially available, such as through Luxlink, part number OS-3141. In a first state, this half of the switch selects DUTs 1 and 3 from the first oven, so 1-1 and 1-3. In the second state, the switch would select DUTs 1-2 and 1-4. The second half of the switch would have the same configuration but would select either 1-5 and 1-7, or 1-6 and 1-8.

FIG. 7 shows a closer view of the single throw quadruple pole switch such as 70, 72, 74, and 76, in FIG. 5. The current configuration is for switch 70 that connects to instrument channel 1. The first setting is for the first oven. Referring back to the sequence set out above, after acquiring all three sets of waveforms from all eight DUTs, in two 4-DUT subsets, the switch would then acquire waveforms from oven 2, etc.

Figure 9:
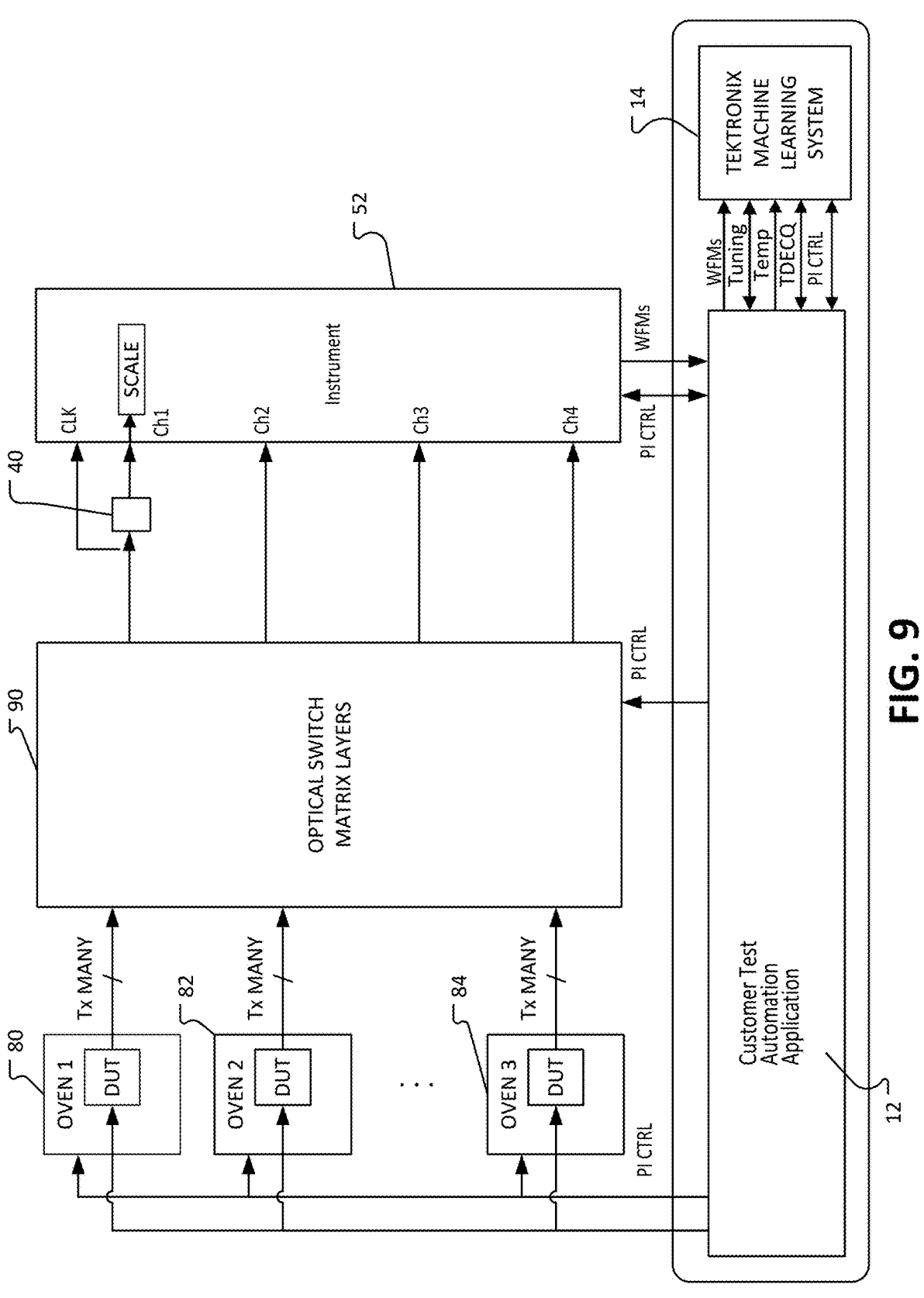
FIG. 9 shows an embodiment of a parallel over pipeline with four channel parallel test and measurement acquisition.

While the above discussion has focused on a number of DUTs per oven, a number of ovens, and two layers of switches, no limitation to those particular dimensions is intended, nor should any be assumed. As shown in FIG. 9, in general, embodiments of this disclosure may include a generalized optical switch matrix that can connect any number of ovens with any number of transmitters in each oven, into four channels of a scope for parallel acquisition. It is this basic test configuration coupled with the novel block of machine learning assisted tuning prediction for optical transmitters that makes up this novel invention.

Figure 8:
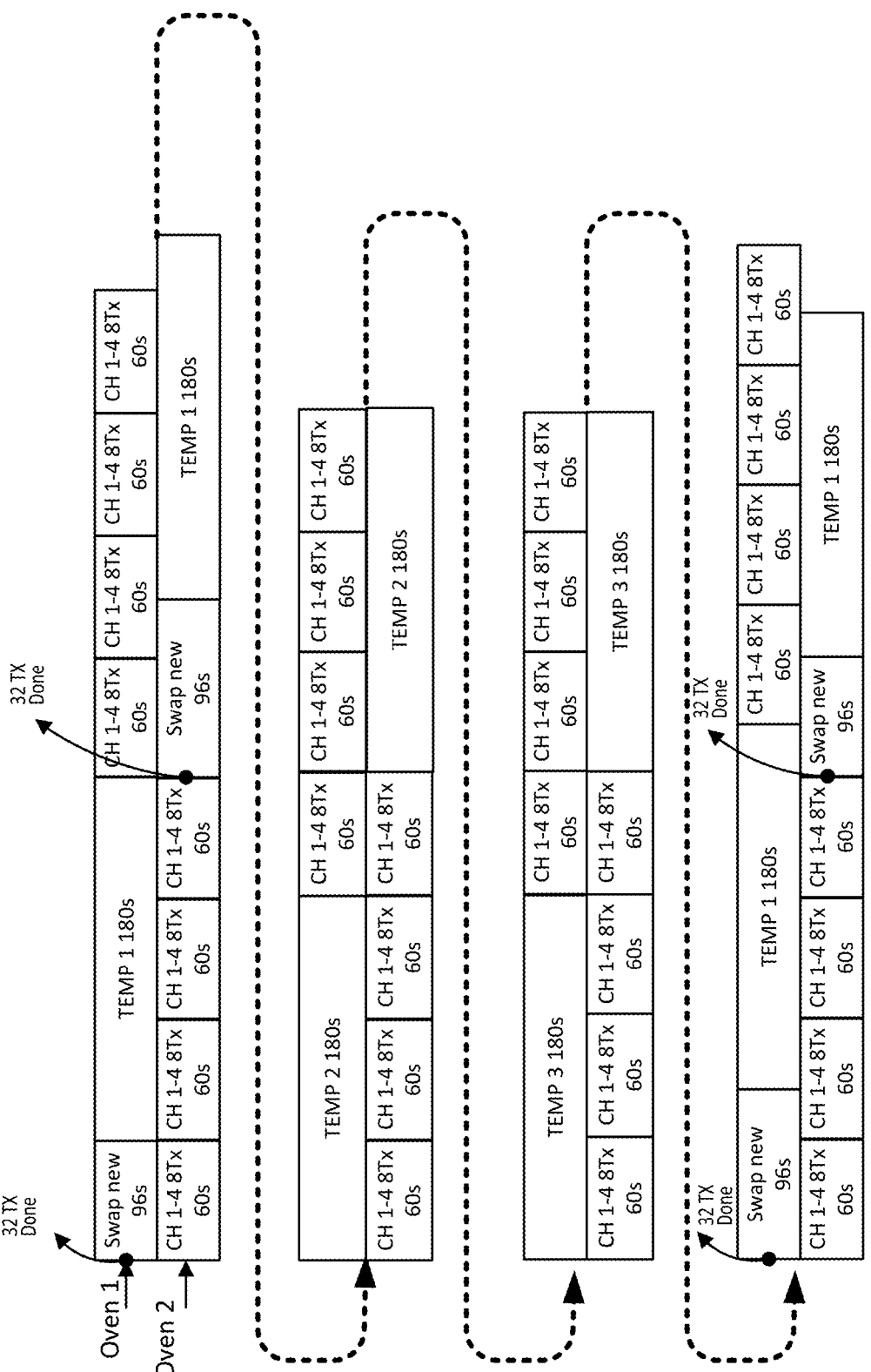
FIG. 8 shows an embodiment of parallel pipeline processing using two ovens, 32 transmitters per oven, and four channels.

As an example of other dimensions for this test system, FIG. 8 shows a parallel oven pipeline using only two ovens. It requires more transmitters per oven, 32, such that the tuning processing time shown in CHX 60s blocks takes longer than the time taken for the ovens to ramp up in temperature. These are the longer blocks. "Swap" blocks represent the time it takes to unload the oven and load the oven with transmitters for the next round of tests. As long as the prediction time in CHX 60s blocks is longer than the temperature ramp up time in TEMP blocks plus the load/ unload blocks in Swap blocks, then the overall tuning time only depends on the scope acquisition time plus DSP prediction time plus overhead associated with that. This means the temperature ramp up time and the oven loading and unloading time go to a virtual zero and have no effect on the overall speed of tuning.

FIG. 9 shows the more general block diagram showing that the number of ovens 80, 82, and 84, can be any number and hold different numbers of transmitters. As long as there are enough transmitters in each oven so that temperature ramp up time is shorter than the time it takes to process the transmitters in the oven, then it can operate at maximum speed only depending on the CH processing blocks for prediction to determine speed of tuning. The layers of switches can change as needed and form the optical switch matrix 90. As discussed above this embodiment shows an ET, or other sampling, instrument that requires the clock recovery using splitter 40. Different instruments, such as RT scopes, would not require that.

These embodiments use an extra layer of optical switches to allow for parallel scope acquisition to be used in the pipeline processing. The Optical Tuning machine learning assisted Block, coupled with a novel parallel oven pipeline and parallel scope channel acquisition, and switching archi- tecture results in making the cycle times of ovens go to virtual zero, and results in machine learning assisted speed up of predicting optimized tuning parameters. This combi- nation of features results in an ideal 320× tuning speed improvement for the worst-case customer that takes 2 hours to tune.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedi- cated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, com- ponents, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non- transitory computer-readable media, which may be read and executed by one or more processors. Such instructions may be referred to as a computer program product. Computer- readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable, or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the disclosed technologies are provided below. An embodiment of the technologies may include one or more, and any combination of, the examples described below.

Example 1 is a test system, comprising: a test and measurement instrument having a number of channels; ovens configured to hold a number of devices under test (DUT); oven switches, each oven switch selectably con- nected to the DUTs in a dedicated oven; channel switches selectably connected to the oven switches, each channel switch connected to one channel of the test and measure- ment instrument; one or more processors configured to execute code that cause the one or more processors to: select an oven as a selected oven, and select a corresponding oven switch as a selected oven switch; control the selected oven switch to connect to a subset of DUTs in the selected oven; control the channel switches to connect to the selected oven switch to receive signals from the subset of DUTs from the selected oven and send the signals to the channels of the test and measurement instrument to acquire waveforms from the subset of DUTs in parallel; repeat the control of the channel switches and the selected oven switch until waveforms from each DUT in the selected oven have been acquired; use machine learning to tune each DUT in the selected oven to a set of parameters; acquire waveforms from the DUTs in the selected oven and compute measurements on the waveforms to determine if each DUT in the selected oven is optimally tuned; and repeat the selection of a next oven, a corresponding next oven switch, and control of the channel switches until each DUT in each oven has been tuned and tested.

Example 2 is the test system of Example 1, wherein a number of channel switches corresponds to the number of channels on the test and measurement instrument.

Example 3 is the test system of either of Examples 1 and 2, wherein the oven switches comprise a number of switches based upon the number of DUTs in each oven.

Example 4 is the test system of any of Examples 1 through 3, wherein the one or more processors are further configured to control the ovens to cause the ovens to cycle through multiple temperatures, and the one or more processors repeat the control of the selected oven switches and the channel switches for each temperature.

Example 5 is the test system of any of Examples 1 through 3, wherein the DUTs comprise one of either electronic devices, optical transceivers, or optical transmitters.

Example 6 is the test system of any of Examples 1 through 3, wherein the code that causes the one or more processors to use machine learning to tune each DUT comprises code to cause the one or more processors to: sequence transmission of the acquired waveforms from each DUT in the selected oven to a machine learning network; and use the machine learning network to analyze the waveforms and provide tuning parameters for each DUT.

Example 7 is the test system of Example 6, wherein the one or more processors are further configured to control the ovens to cycle through multiple temperatures, and the one or more processors repeat the sequencing transmission of the acquired waveforms and use of the machine learning network for each temperature for each DUT in each oven.

Example 8 is the test system of any of Examples 1 through 3, wherein: there are four ovens and each oven holds eight optical transmitters; there are four oven switches, each configured to select a subset of four optical transmitters; and there are four channel switches, each channel switch connects between the four oven switches and one channel of the test and measurement instrument.

Example 9 is the test system of any of Examples 1 through 3, wherein the test and measurement instrument comprises an oscilloscope.

Example 10 is a method of testing devices under test, DUTs, in a plurality of ovens, the method comprising: selecting an oven from the plurality of ovens as a selected oven, and selecting a corresponding oven switch as a selected oven switch; controlling the selected oven switch to connect to a subset of DUTs in the selected oven; controlling the channel switches to connect to the selected oven switch to receive signals from the subset of DUTs from the selected oven and send the signals to channels of a test and measurement instrument to acquire waveforms from the subset of DUTs in parallel; repeating the control of the channel switches and the selected oven switch until waveforms from each DUT in the selected oven have been acquired; using machine learning to tune each DUT in the selected oven to a set of parameters; acquiring waveforms from the DUTs in the selected oven and computing measurements on the waveforms to determine if each DUT in the selected oven is optimally tuned; and repeating the selection of a next oven, a corresponding next oven switch, and control of the channel switches until each DUT in each oven of the plurality of ovens has been tuned and tested.

Example 11 is the method of Example 10, wherein a number of channel switches corresponds to a number of channels on the test and measurement instrument.

Example 12 is the method of either of Examples 10 or 11, wherein the oven switches comprise a number of switches based upon the number of DUTs in each oven.

Example 13 is the method of any of Examples 10 through 12, further comprising controlling the ovens to cause the ovens to cycle through multiple temperatures, and repeating the controlling of the selected oven switches and the channel switches for each temperature.

Example 14 is the method of any of Examples 10 through 13, wherein the DUTs comprise one of either electronic devices, optical transceivers, or optical transmitters.

Example 15 is the method of any of Examples 10 through 14, wherein using machine learning to tune each DUT comprises: sequencing transmission of the acquired waveforms from each DUT in the selected oven to a machine learning network; and using the machine learning network to analyze the waveforms and provide tuning parameters for each DUT.

Example 16 is the method of Example 15, further comprising controlling the ovens to cycle through multiple temperatures, and repeating the sequencing transmission of the acquired waveforms and using the machine learning network for each temperature for each DUT in each oven.

Example 17 is the method of any of Examples 10 through 16, wherein using the machine learning system comprises: receiving waveforms from each DUT; and applying machine learning to the waveforms to produce tuning parameters for the DUT.

Example 18 is the method of any of Examples 10 through 17, wherein the test and measurement instrument comprises an oscilloscope.

Example 19 is a test system, comprising: a test and measurement instrument having a number of channels; ovens configured to hold a number of devices under test (DUT), the number of DUTs in each oven being high enough to allow a temperature ramp up time to be less than a time to process all the DUTs in an oven; a switch matrix configured to connect between the DUTs in each oven and the channels of the test and measurement instrument; one or more processors configured to execute code that cause the one or more processors to: control the switch matrix to connect to at least some of the DUTs in an initial set of ovens set at a first temperature to acquire a set of waveforms with the test and measurement instrument; set a next set of ovens at an initial temperature; transmit the set of waveforms to a machine learning network; receive optimal tuning parameters for the DUTs at the initial temperature; test the DUTs using the optimal tuning parameters to determine if the DUTs are optimally tuned; set the initial set of ovens to a next temperature; and repeat the control, transmit, receive, and test for the next set of ovens at a next temperature until all DUTs in all ovens have been tested at all temperatures of a predefined set of test temperatures.

Example 20 is the test system of Example 19, wherein the test and measurement instrument comprises an oscilloscope.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific aspects of this disclosure have been illustrated and described for purposes of illustration, it will be understood that various modifications may be made without departing from the spirit and scope of the invention. Accordingly, the invention should not be limited except as by the appended claims.

The invention claimed is:

1. A test system, comprising:
a test and measurement instrument having a number of channels;
ovens configured to hold a number of devices under test (DUT);
oven switches, each oven switch selectably connected to the DUTs in a dedicated oven;
channel switches selectably connected to the oven switches, each channel switch connected to one channel of the test and measurement instrument;
one or more processors configured to execute code that cause the one or more processors to:
select an oven as a selected oven, and select a corresponding oven switch as a selected oven switch;
control the selected oven switch to connect to a subset of DUTs in the selected oven;
control the channel switches to connect to the selected oven switch to receive signals from the subset of DUTs from the selected oven and send the signals to the channels of the test and measurement instrument to acquire waveforms from the subset of DUTs in parallel;
repeat the control of the channel switches and the selected oven switch until waveforms from each DUT in the selected oven have been acquired;
use machine learning to tune each DUT in the selected oven to a set of parameters;
acquire waveforms from the DUTs in the selected oven and compute measurements on the waveforms to determine if each DUT in the selected oven is optimally tuned; and
repeat the selection of a next oven, a corresponding next oven switch, and control of the channel switches until each DUT in each oven has been tuned and tested.

2. The test system as claimed in claim 1, wherein a number of channel switches corresponds to the number of channels on the test and measurement instrument.

3. The test system as claimed in claim 1, wherein the oven switches comprise a number of switches based upon the number of DUTs in each oven.

4. The test system as claimed in claim 1, wherein the one or more processors are further configured to control the ovens to cause the ovens to cycle through multiple temperatures, and the one or more processors repeat the control of the selected oven switches and the channel switches for each temperature.

5. The test system as claimed in claim 1, wherein the DUTs comprise one of either electronic devices, optical transceivers, or optical transmitters.

6. The test system as claimed in claim 1, wherein the code that causes the one or more processors to use machine learning to tune each DUT comprises code to cause the one or more processors to:
sequence transmission of the acquired waveforms from each DUT in the selected oven to a machine learning network; and
use the machine learning network to analyze the waveforms and provide tuning parameters for each DUT.

7. The test system as claimed in claim 6, wherein the one or more processors are further configured to control the ovens to cycle through multiple temperatures, and the one or more processors repeat the sequencing transmission of the acquired waveforms and use of the machine learning network for each temperature for each DUT in each oven.

8. The test system as claimed in claim 1, wherein:
there are four ovens and each oven holds eight optical transmitters;
there are four oven switches, each configured to select a subset of four optical transmitters; and
there are four channel switches, each channel switch connects between the four oven switches and one channel of the test and measurement instrument.

9. The test system as claimed in claim 1, wherein the test and measurement instrument comprises an oscilloscope.

10. A method of testing devices under test, DUTs, in a plurality of ovens, the method comprising:
selecting an oven from the plurality of ovens as a selected oven, and selecting a corresponding oven switch as a selected oven switch;
controlling the selected oven switch to connect to a subset of DUTs in the selected oven;
controlling the channel switches to connect to the selected oven switch to receive signals from the subset of DUTs from the selected oven and send the signals to channels of a test and measurement instrument to acquire waveforms from the subset of DUTs in parallel;
repeating the control of the channel switches and the selected oven switch until waveforms from each DUT in the selected oven have been acquired;
using machine learning to tune each DUT in the selected oven to a set of parameters;
acquiring waveforms from the DUTs in the selected oven and computing measurements on the waveforms to determine if each DUT in the selected oven is optimally tuned; and
repeating the selection of a next oven, a corresponding next oven switch, and control of the channel switches until each DUT in each oven of the plurality of ovens has been tuned and tested.

11. The method as claimed in claim 10, wherein a number of channel switches corresponds to a number of channels on the test and measurement instrument.

12. The method as claimed in claim 10, wherein the oven switches comprise a number of switches based upon the number of DUTs in each oven.

13. The method as claimed in claim 10, further comprising controlling the ovens to cause the ovens to cycle through multiple temperatures, and repeating the controlling of the selected oven switches and the channel switches for each temperature.

14. The method as claimed in claim 10, wherein the DUTs comprise one of either electronic devices, optical transceivers, or optical transmitters.

15. The method as claimed in claim 10, wherein using machine learning to tune each DUT comprises:

sequencing transmission of the acquired waveforms from each DUT in the selected oven to a machine learning network; and using the machine learning network to analyze the waveforms and provide tuning parameters for each DUT.

16. The test control system as claimed in claim 15, further comprising controlling the ovens to cycle through multiple temperatures, and repeating the sequencing transmission of the acquired waveforms and using the machine learning network for each temperature for each DUT in each oven.

17. The method as claimed in claim 10, wherein using the machine learning system comprises:

receiving waveforms from each DUT; and applying machine learning to the waveforms to produce tuning parameters for the DUT.

18. The method as claimed in claim 10, wherein the test and measurement instrument comprises an oscilloscope.

\* \* \* \* \*